United States Patent [19]
Kimmich et al.

[11] Patent Number: 5,103,175
[45] Date of Patent: Apr. 7, 1992

[54] METHOD FOR A MULTI-DIMENSIONAL MEASUREMENT OF MAGNETIC RESONANCE IN DEFINED SMALL VOLUME REGIONS OF A SOLID-STATE SAMPLE

[75] Inventors: Rainer Kimmich, Ulm; Eberhard Rommel, Ulm-Gögglingen; Siegfried Hafner, Blaustein, all of Fed. Rep. of Germany

[73] Assignee: Bruker Medizintechnik GmbH, Rheinstetten-Forcheim, Fed. Rep. of Germany

[21] Appl. No.: 548,174

[22] Filed: Jul. 3, 1990

[30] Foreign Application Priority Data

Jul. 8, 1989 [DE] Fed. Rep. of Germany ....... 3922505

[51] Int. Cl.$^5$ ............................................. G01R 33/20
[52] U.S. Cl. ..................................... 324/309; 324/307
[58] Field of Search ............... 324/300, 307, 308, 309, 324/310, 311, 312, 313, 314, 318, 322, 320, 319; 335/216

[56] References Cited

U.S. PATENT DOCUMENTS

| | | | |
|---|---|---|---|
| 4,320,342 | 3/1982 | Heinzerling | 324/319 |
| 4,535,291 | 8/1985 | Lee et al. | 324/320 |
| 4,595,899 | 6/1986 | Smith et al. | 335/216 |

FOREIGN PATENT DOCUMENTS

| | | |
|---|---|---|
| 0026265 | 7/1980 | European Pat. Off. |
| 0259998 | 8/1987 | European Pat. Off. |

OTHER PUBLICATIONS

Journal of Magnetic Resonance 81, No. 2, Feb. 1, 1989, pp. 232–240, "Theoretical Treatment of Volume Selective NMR Spectroscopy (VOSY) Applied to Coupled Spin Systems", from R. Kimmich, E. Rommel and A. Knüttel.

Journal of Magnetic Resonance 83, No. 2, Jun. 15, 1989, pp. 299–308, "Slice Excitation and Localized NMR Spectroscopy on the Basis of Spin Locking", from E. Rommel and R. Kimmich.

Journal of Magnetic Resonance 86, No. 2, Feb. 1, 1990, pp. 264–272, "NMR Imaging of Solids by Jeener-Broekaert Phase Encoding", from E. Rommel, S. Hafner, and R. Kimmich.

Journal of Magnetic Resonance 66; Issue of 1986; pp. 530–535; Authors: G. C. Chingas; J. B. Miller and A. N. Garroway; Titel; NMR Images of Solids.

Physical Review, vol. 157, No. 2 of May 10, 1967; pp. 232–240; Authors: J. Jeener and P. Broekaert; Title: Thermodynamic Effects of a Pair of RF Pulses Nuclear Magnetic Resonance in Solids.

*Primary Examiner*—Michael J. Tokar
*Attorney, Agent, or Firm*—Rosenblum, Parish & Bacigalupi

[57] ABSTRACT

A method is disclosed for a multi-dimensional measurement of magnetic resonance in defined small volume regions of solid-state samples. The samples are arranged in a uniform homogeneous magnetic field and, in a predetermined manner, irradiated with a sequence of high frequency pulses as well as exposed to a sequence of gradient magnetic field pulses. This is done in such a way that the spin magnetization to be measured is maintained for a time interval which is longer then the amount of time needed to switch-off the gradient magnetic field pulses. Initially, in a first time interval, the magnetization of a single slice only of the sample is transferred into a transverse magnetization tilted by 90° with respect to the direction of the constant homogeneous magnetic field. Thereupon, in a second time interval, volume selective gradient magnetic field pulses are irradiated on the sample. In a subsequent third time interval, during the persistance of the volume selective gradient magnetic field pulses, high frequency pulses are irradiated on the sample, for transferring the transverse magnetization in the volume region to be measured into a multipole-state, said state being insensitive to the volume selective magnetic field pulses and persisting until after the point in time when these pulses are switched-off. Finally, in a subsequent fourth time interval, the multipole-state is transferred back again into a transverse magnetization and this magnetization is readout as a signal.

7 Claims, 7 Drawing Sheets

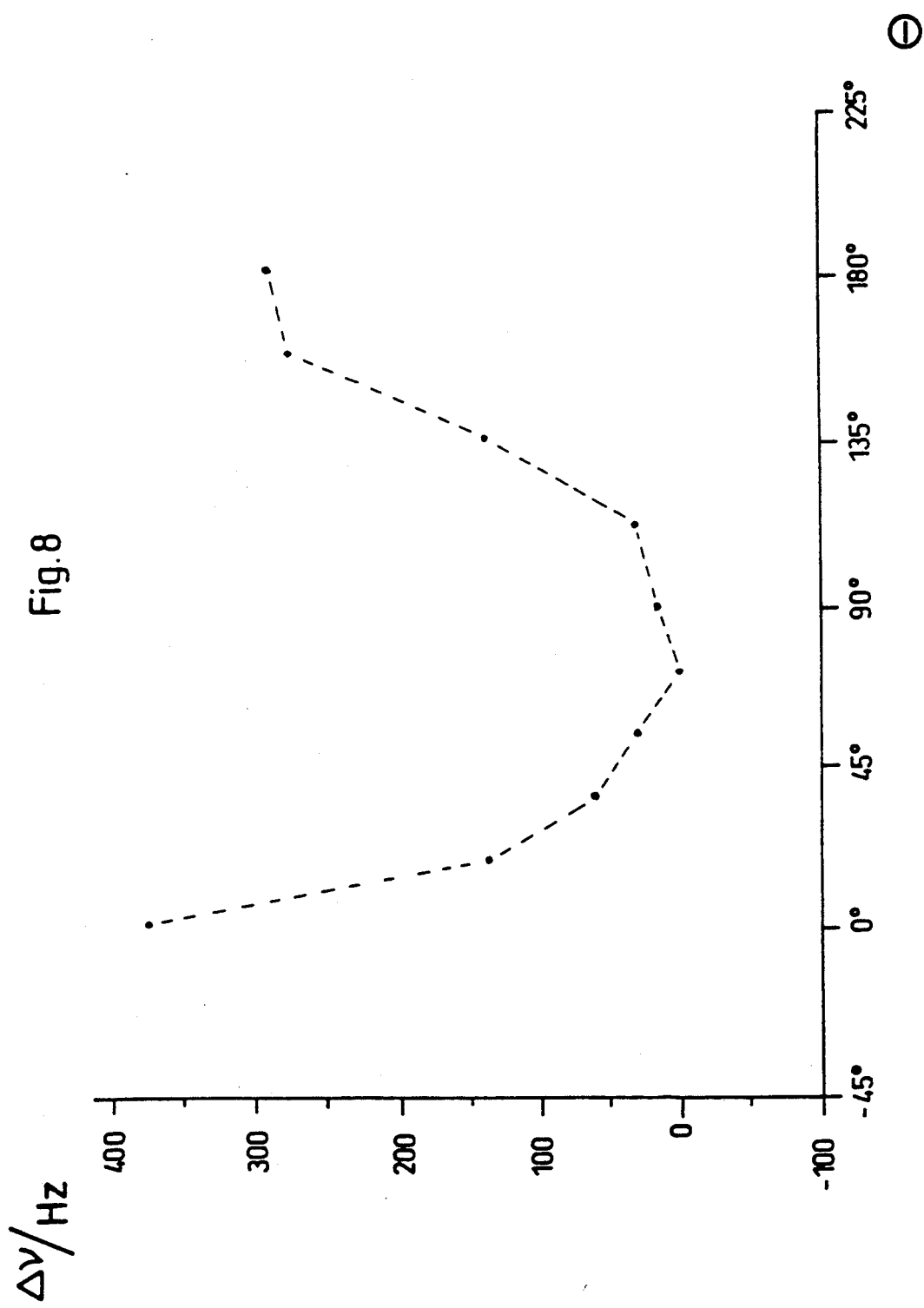

METHOD FOR A MULTI-DIMENSIONAL MEASUREMENT OF MAGNETIC RESONANCE IN DEFINED SMALL VOLUME REGIONS OF A SOLID-STATE SAMPLE

BACKGROUND OF THE INVENTION

This invention relates to a method for the multi-dimensional measurement of magnetic resonance in defined small volume regions of a solid-state sample in which the sample is placed in a uniform homogeneous magnetic field and, in a predetermined manner, irradiated with a series of high frequency pulses as well as subjected to a series of gradient magnetic field pulses in such a way that the spin magnetization to be measured is maintained for a period of time which is longer than a switching-off time of the gradient magnetic field pulses.

A method of this kind is disclosed in the Journal of Magnetic Resonance 66 (1986), pp. 530–535.

It is generally known that the technique of magnetic resonance, in particular nuclear magnetic resonance, is applicable to two- or three-dimensional measurements in defined small volume regions of samples. In particular, in medical research and in medical diagnostics, measurements of living or non-living human tissue are approached in this manner. In so doing, one distinguishes localized spectroscopic measurements in which a nuclear resonance spectrum of a small volume region only is recorded from imaging procedures with which a two- or three-dimensional representation of a body portion in the form of a picture of the spin density or relaxation time is generated and recorded.

Up to now, such volume selective measurements were largely undertaken of liquid samples. This is possible in a straight-forward manner since, due to molecular motion, liquid samples exhibit relatively narrow lines or slow pulses nuclear resonance signal decay times. During the relatively long time period during which this signal lasts, in the order of magnitude of many hundreds of milliseconds, the necessary measurement procedures can be undertaken in order to select and read out a small volume region. The measurement procedures consist, for the most part, of the application of gradient magnetic field pulses for which, for technical reasons, specific minimum switch-on and switch-off times are required.

If one carries out this type of measurement on solid-state bodies, the following problem results: Due to the internal field associated with solid-state bodies, the line width is appreciably larger and/or the decay time of the excited nuclear resonance signal is appreciably shorter, specifically of the order of magnitude of only several tens of microseconds. As a result, it is not technically possible to switch on and off the necessary read or phase encoding gradients during the extremely short time period over which this signal lasts, in particular, when strong gradients are required.

For this reason, in undertaking volume selective measurements on solid-state bodies in the few experiments known to date, one had utilized various special techniques to minimize the line width of the solid-state signal and/or extend the decay time of said signal.

In one known method of the kind mentioned at the outset, a multi-pulse sequence (MREV-8) is introduced in order to achieve a narrowing of the lines. This prior art multi-pulse sequence is, furthermore, developed in such a way that a "storage" of the magnetization is established for a period of time which is sufficient to allow the gradient magnetic field pulses to once again being switched-off.

The prior art method has, however, the disadvantage that read gradients must be utilized in order to record the signal. These read gradients produce a degradation in homogeneity of the constant magnetic field and, therewith, a systematic line-broadening. The prior art method is, therefore, limited in applications involving samples with narrow lines, and does not facilitate line-shape measurements, since, for the reasons mentioned, the measured line-shape is widened as compared to the pure line-shape as a result of the read gradients.

It is also known that, in solid-state measurements, problems associated with wide lines and/or fast signal decays are mitigated against by rotating the sample around the so-called "magic angle". In order to do so, the rotation must be undertaken using a relatively high rotation frequency of many kHz. The fast rotation of the solid-state body simulates the fast molecular motion of liquids, thereby averaging out the local fields. However, at such high rotational frequencies, the samples must be, for mechanical reasons, rotationally symmetric. Even with rotationally symmetric samples, there is nevertheless the danger that a deformation of the sample will occur due to the very high rotational frequencies.

This prior art method is, therefore, not applicable to measurements of biological samples such as extracted teeth. Such natural samples have random irregular shapes and sample deformation is not acceptable in cases where the biological sample is still needed after the measurement. This is, for example, the case in modern dentistry when an unhealthy tooth is first extracted, measured, then treated and, finally, reimplanted.

SUMMARY OF THE INVENTION

It is, therefore, an object of this invention to further improve a method of the kind mentioned at the outset in such a way that two- and three-dimensional measurements are possible without the additional aid of read gradients and, furthermore, that line shape analyses in volume selective measurements on solid-state bodies are possible.

This object is achieved in a two-dimensional measurement according to this invention in that initially, during a first time interval, the magnetization of only one slice of the sample is transferred into a transverse magnetization which is tilted by 90°. Thereupon, in a succeeding second time interval, volume selective gradient magnetic field pulses are switched-on. In a succeeding third time interval during which the volume selective gradient magnetic field pulses persist, high frequency pulses irradiate the sample, said high frequency pulses transferring the transverse magnetization in the volume region to be measured into multipole-state, said state being insensitive to the volume selective gradient magnetic field pulses and persisting until after the point in time when the volume selective gradient magnetic field pulses are switched-off. Finally, in a fourth succeeding time interval, the multipole-state is again transferred back into a transverse magnetization which is read out as a signal.

The object, underlying this invention, is, further, achieved in a three-dimensional measurement in that, in a first time interval volume selective gradient magnetic field pulses are switched-on. In a succeeding second time interval during which the volume selective gradient magnetic field pulses persist, high frequency pulses irradiate the sample, said high frequency pulses transferring the magnetization in the volume region to be measured into a multipole-state, said state being insensitive to the volume selective gradient magnetic field pulses and persisting until after the point in time when the volume selective gradient magnetic field pulses are switched-off. Finally, in a third succeeding time interval, the multipole-state is again transferred back and is read out as a signal.

In this manner, the object underlying this invention is fully achieved. Through irradiation with the high frequency pulses during the time when the volume selective gradient magnetic field pulses persist, the magnetization of interest is transferred into a state (dipole or quadrupole state) which is no longer sensitive to the magnetic field pulses, said state persisting long enough to allow the magnetic field pulses to be switched-off in a technically feasible manner. Since the subsequent read-out of the signal transpires without the use of read gradients, the line shape of the signal remains undistorted and can be analyzed.

In this manner, entirely new types of volume selective measurements of solid-state bodies can be undertaken. Particularly, advantageous are not only measurements on biological samples such as bone or the already mentioned extracted teeth, but also execution of many other measurements on, for example, plastics in order to, by way of example, determine the chain orientation of said plastics. By way of example, if a plastic is extruded in order to make containers or the like, volume selective measurements of the workpiece can be undertaken in order to determine the molecular orientation and/or chain orientation configuration of the plastic resulting from the extrusion process at various places on the workpiece. Since the chain orientation of the plastic is an important gauge of its stability, it is, for example, possible to determine if all portions of a container (e.g. a plastic bottle) are sufficiently sound.

In a particularly preferred embodiment of the two-dimensional measurement method according to the invention, during the first time interval the transverse magnetization is produced with a first pulse sequence. Said pulse sequence consists of a first "hard" 90° high frequency pulse immediately followed by a spin lock pulse whose phase position is shifted by 90° with respect to that of the first 90° high frequency pulse, and directly thereafter, a second 90° high frequency pulse whose phase position is shifted by 180° with respect to that of the first 90° high frequency pulse. This pulse sequence for the generation of the transverse magnetization is, in and of itself, described in applicant's co-pending International (PCT) Patent Application No. PCT/DE 90/00190 being based on West-German priority patent application P 39 08 392.6, the disclosure of which being incorporated herein by reference. This has the advantage that after the end of the pulse sequence the entire magnetization of the selected slice is "locked" and aligned in the z-direction, being the direction of the constant magnetic field and does, therefore, not dephase, while the magnetization of the entire remaining volume outside of the slice dephases in an uncontrolled manner and, thereby, does not produce any signal during the subsequent running of the measurement.

It is, furthermore, particularly preferable in both of the abovementioned methods when irradiation with the second pulse sequence intended for transfer into and out of the multipole-state, respectively, consists of a 90° high frequency pulse followed after a time delay by a first 45° high frequency pulse, and then after a further time delay by a second 45° high frequency pulse. The phases of the 45° high frequency pulses are preferably adjusted with respect to the 90° high frequency pulse so that they are of equal alternate phase or so that both are shifted by 90°.

The use of this pulse sequence is known per se from Physical Review 157 (1967), pp. 232–240, taking advantage of the transfer into a multipole-state to make the magnetization insensitive to the switching-off of the volume selective gradient magnetic field pulses. At the same time, the magnetization of interest is extended by an amount of time long enough to allow the magnetic field pulses to be switched-off. Signal read-out can then transpire without the presence of magnetic field pulses and, as a result, the line shape is maintained in an undistorted fashion.

Although the following description will be based on the example of proton nuclear magnetic resonance, it goes without saying that the present invention is also applicable to other kinds of magnetic resonance (e.g. electron paramagnetic resonance) as is apparent for a person of ordinary skill in the art of magnetic resonance.

Other aspects and advantages of the present invention will become apparent from the following description of the preferred embodiments, taken in conjunction with the accompanying drawings, which illustrate, by way of example, the principles of the invention.

Although the invention will be described hereinafter in detail with reference to the presently-preferred embodiments, those of ordinary skill in the art will appreciate that various modifications can be made without departing from the invention.

BRIEF DESCRIPTION OF THE DRAWINGS

FIG. 8 shows a diagram describing the angular dependence of the frequency of the signal maximum in accordance with the measurement of FIG. 7.

DESCRIPTION OF THE PREFERRED EMBODIMENTS

Figure 1:
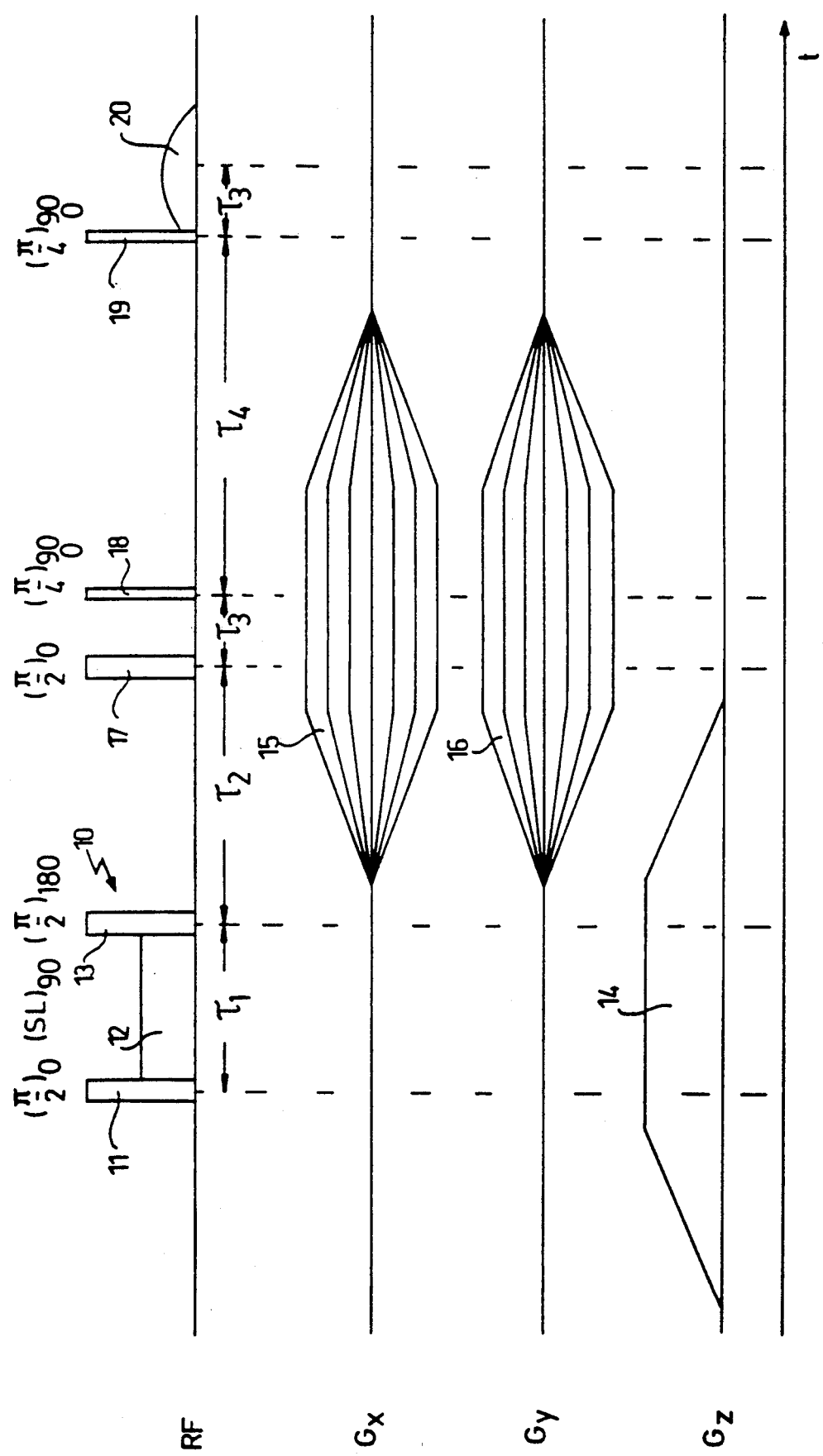
FIG. 1 shows a pulse sequence associated with a first example of the method according to the invention for a two-dimensional measurement.

FIG. 1 shows as a function of time t and, vertically separated from each other, on axis RF, various high frequency pulses and on axes $G_x$, $G_y$, and $G_z$ gradient magnetic field pulses.

In two-dimensional volume selective measurements with nuclear magnetic resonance signals in a solid-state sample, a slice selection is made by using pulse sequence 10. The slice selection consists of a first 90° pulse 11, immediately followed by a spin-lock pulse 12 as well as a second 90° pulse 13, whereby irradiation of entire pulse sequence 10 transpires in the presence of a gradient magnetic field pulse 14 in the z-direction.

Pulse sequence 10 flips the entire slice for section of z axis magnetization defined through the action of gradient magnetic field pulse 14 and, in this way, produces a transverse magnetization. Following spin-lock pulse 12 is phase-shifted by 90° with respect to first 90° pulse 11, and, accordingly, the high frequency field direction coincides properly with the magnetization direction, affecting only those spins that are in resonance, that is to say those spins which are located in the selected slice. In this manner, the magnetization of the slice is "locked", i.e. it does not dephase and its state is retained. On the other hand, the magnetization of the remaining volume region of the sample dephases in an uncontrolled manner so that it cannot contribute to further signal production.

Pulse sequence 10, which is also referred to as "LOSY" in the abovementioned co-pending International Patent Application has the advantage that a shaped high frequency pulse (sinc pulse, or the like) is not necessary and that z-gradient magnetic field pulse 14 is limited to be only of the order of magnitude which corresponds t the line width.

Following expiration of time interval $\tau_1$ specified by pulse sequence 10, a second time interval $\tau_2$ occurs in which two phase gradient magnetic field pulses 15 and 16 in the x- and y-directions, respectively, are switched-on. As indicated in FIG. 1, both magnetic field pulses 15, 16 are phase-encoded, that is to say, their amplitude is switched in incremental steps.

It is further clearly indicated in FIG. 1 that specific time intervals of noticeable length are required both to switch-on and to switch-off magnetic field pulses 14, 15, 16 the duration of which is of consequence to the present discussion.

Following switching-on of phase gradient magnetic field pulses 15, 16, is a third time interval $\tau_3$ at the beginning of which a 90° high frequency pulse 17 and at the end of which a 45° high frequency pulse 18 irradiate the sample. In this way, depending on the sample being measured, a dipole or quadrupole state is generated which, first of all, persists for an amount of time which is longer than that which would correspond to the natural line width of a solid-state signal, and second of all has the effect that the signal in this state is insensitive to gradient magnetic field pulses 15 and 16.

In this manner, as can be clearly seen in FIG. 1, it is possible in a subsequent fourth time interval $\tau_4$ to switch-off the two phase gradient magnetic field pulses 15 and 16, without having the desired magnetization information prematurely fade away.

After switching-off phase gradient magnetic field pulses 15 and 16, and during a fifth time interval which is again of duration $\tau_3$, the signal can be transferred back out of the dipole state or quadrupole state, respectively, with a second 45° high frequency pulse 19 and be read out as a signal 20. In this manner, the signal is read out after the end of phase gradient magnetic field pulses 15 and 16, and the line shape of the measured nuclear magnetic resonance signal is unaffected since a deterioration of the magnet field homogeneity is unaffected since a deterioration of the magnet field homogeneity due to additional magnetic field pulses does not occur.

Within the context of the measurement described above, two separate individual measurements, one for each phase setting of phase gradient magnetic field pulses 15 and 16, are undertaken. This is done by setting the phases of both 45° high frequency pulses 18 and 19 during the first individual measurement to be the same as that of preceding 90° high frequence pulse 17. In the subsequent individual measurement, the phases of both of the 45° high frequency pulses 18 and 19 are rotated by 90°. This method, which also can be described as serial quadrature detection, mitigates against the occurrence of image frequencies during the recording of the signals. In so doing, the entire measurement time is doubled which, however, is not as critical for solid-state samples as it is with measurements on liquids or, in particular, on living human tissue, since, in the latter case, there is cause for concern about artifacts associated with long measurement times.

As a consequence of the two sequential individual measurements with the phases of 45° high frequency pulses 18 and 19 being rotated by 90°, the real and imaginary parts in the time domain and, therewith, the entire spectral information of interest are measured.

In order to achieve an optimum signal amplitude, the duration of the time interval $\tau_3$ is adjusted so that it approximately corresponds to the steepest decay constant of the free induction signal. In this manner, approximately 56% of the original magnetization is analyzed as an echo signal.

Figure 2:
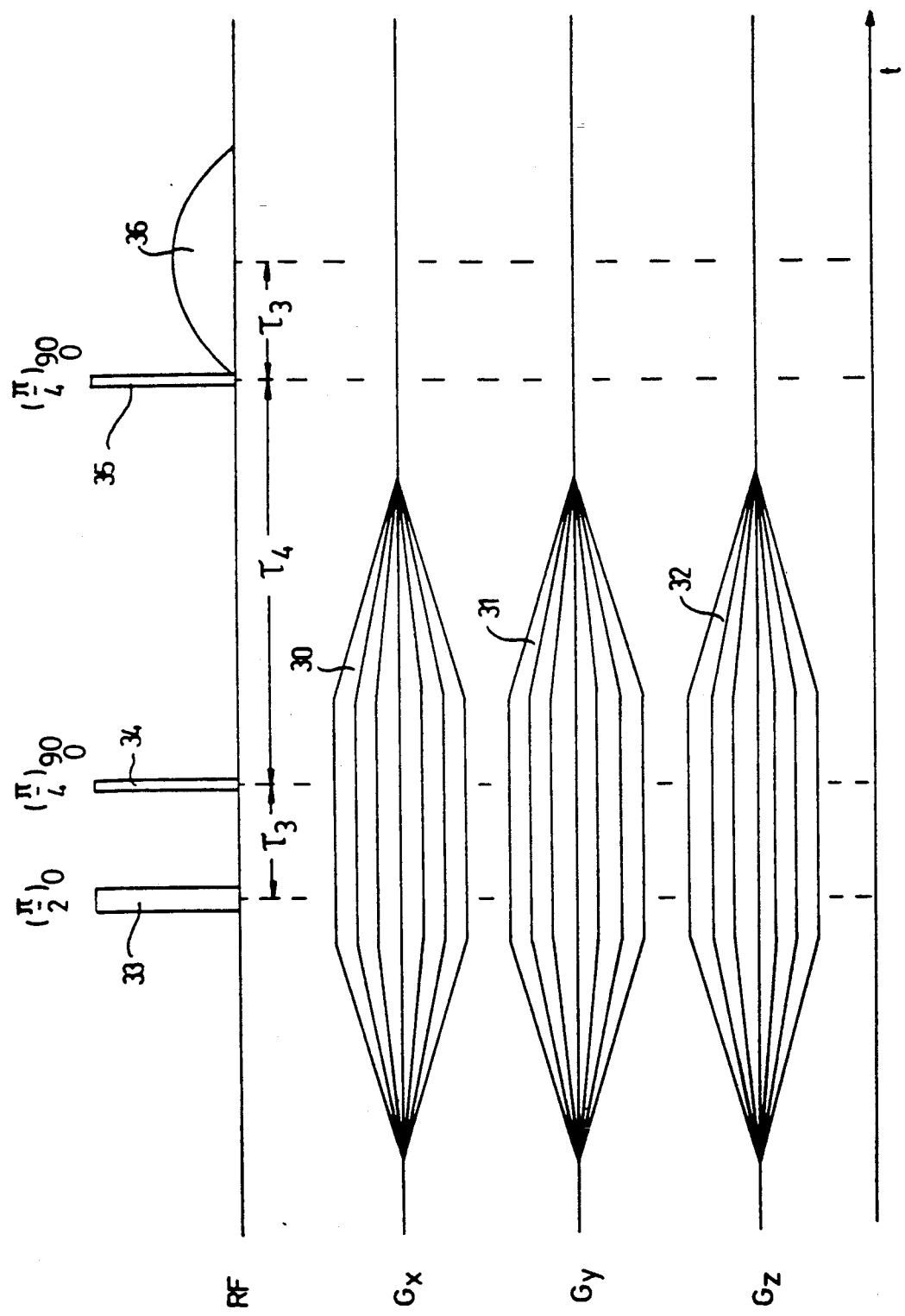
FIG. 2 shows a representation similar to that of FIG. 1, however for a three-dimensional measurement.

In the embodiment represented by FIG. 2, three-dimensional measurements are carried out.

In the case of FIG. 2, the experiment is started without slice selection and, as is clearly seen in FIG. 2, three phase gradient magnetic field pulses 30, 31, and 32 are promptly switched on in the x-, y-, and z-directions. When the three magnetic field pulses 30 through 32 are switched on, the experiment proceeds in a manner similar to that of FIG. 1 from the third time interval $\tau_3$ on. In this connection, in the experiment of FIG. 2, a 90° high frequency pulse 33 is initially irradiated followed by, after time interval $\tau_3$, a first 45° high frequency pulse 34, wherein the physical phenomina are the same as those described above in connection with the experiment of FIG. 1.

At this point, the three gradient magnetic field pulses 30 through 32 are switched-off and, thereupon, after expiration of time interval $\tau_4$, a second 45° high frequency pulse 35 is applied in order to irradiate the sample and enable subsequent read-out of a signal 35.

In this case, it is also true that, in two sequential partial measurements, the phases of the two 45° high frequency pulses 34 and 35 are switched back and forth together by 90°.

In the following, several measurements having resulted of the method illustrated in FIG. 1 will be described. The measurements were carried out on a tomograph with a superconducting magnet system of a field strength of 4.7 T at a proton measurement frequency of 200 MHz. Cylindrically shaped gradient coils with diameters of 30 or 15 cm were used. The maximum phase gradient amounted to 7.5 G/cm. The gradient switch-on time was 2 ms. The phase gradients were sequentially adjusted in 32 steps.

For the measurements described hereinafter, a special sample holder with a 1 cm diameter high frequency solenoid coil was inserted. The length of the 90° high frequency pulse was 5 $\mu$s. The phase-encoding time $\tau_3$ was adjusted to be 85 $\mu$s. The switching time of the gradient magnetic field pulse amounted to 2 ms so that the time $\tau_4$ for the transfer into the multipole-state was adjusted to be approximately 10 ms.

The measurements were carried out on samples made from hexamethylbenzene and polytetrafluoroethylene (PTFE). At room temperature and a frequency of 200 MHz, the spin lattice relaxation time of hexamethylbenzene amounts to about 360 ms. The dipole relaxation time can be estimated to be less than 100 ms, while the transverse relaxation time was about 40 μs.

Figure 4A:
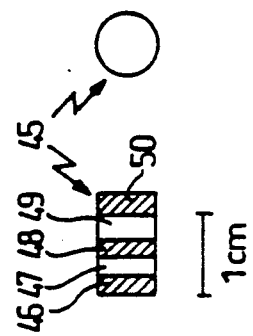
FIG. 4a and 4b show a variation on the measurement of FIG. 3a and FIG. 3b.
Figure 4B:
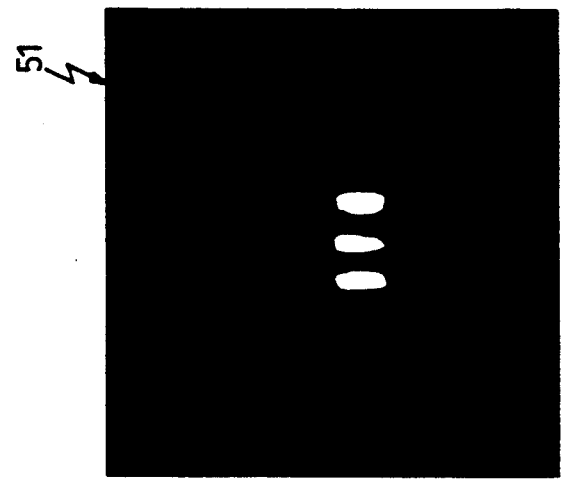
Figure 3A:
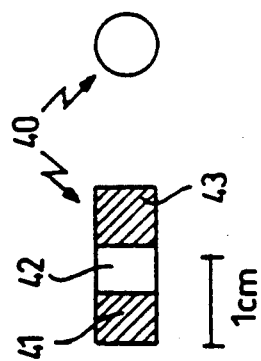
FIG. 3a and 3b show the result of an imaging measurement on a sample with regions of differing material.
Figure 3B:
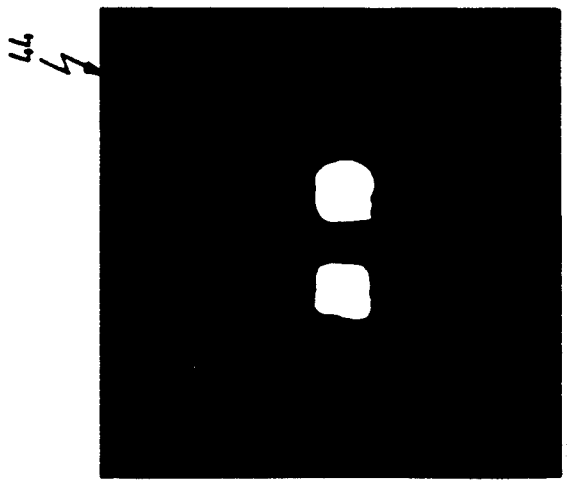

FIGS. 3 and 4 show results from imaging measurements.

FIG. 3a shows a first sample 40 consisting of a first material region 41, a gap 42, and a second material region 43. The corresponding image is labelled as 44. Both material regions 41 and 43 are clearly seen as white spots upon an otherwise black background. Because of the 32 amplitude steps chosen, a 32×32 phase encoding with a corresponding number of pixels could be achieved. For this reason, a spatial resolution of 1.1 mm was obtained. Spin-echo amplitudes only were analyzed. The entire measurement time amounted to about 4 minutes.

FIG. 4 shows a corresponding measurement with a second sample 45 which embodied a total of three material regions 46, 48, and 50 and two gaps 47. As image 51 shows, the fine structured sample 45 is also represented as clearly resolved.

Figure 5:
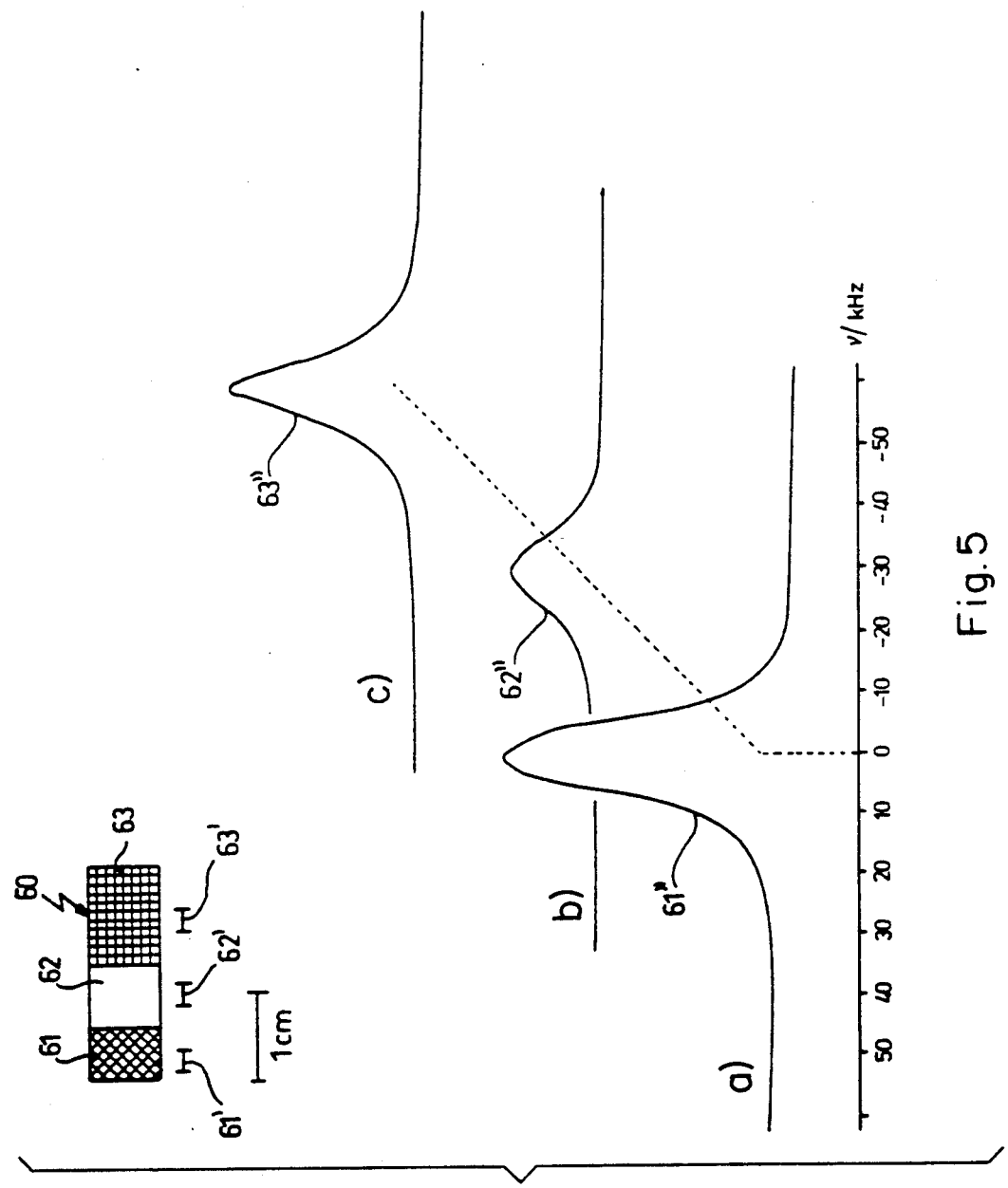
FIG. 5 shows a volume selective measurement of nuclear magnetic resonance spectra in a solid-state sample with regions of differing material.

The upper left of FIG. 5 shows a third sample 60 with a first material region 61 of hexamethylbenzene, a second material region 62 of tetrafluoroethene, and a third material region 63 of polyethylene.

As indicated with the labels 61', 62', and 63', volume selective nuclear magnetic resonances were excited in the three regions 61, 62, and 63 and the corresponding nuclear resonance lines, as shown in the lower right of FIG. 5, were measured. There, graphs a), b), and c) shows three spectral lines 61'', 62'', and 63'' belonging to the three abovementioned material regions 61, 62, and 63 at positions 61', 62', and 63'.

Figure 6:
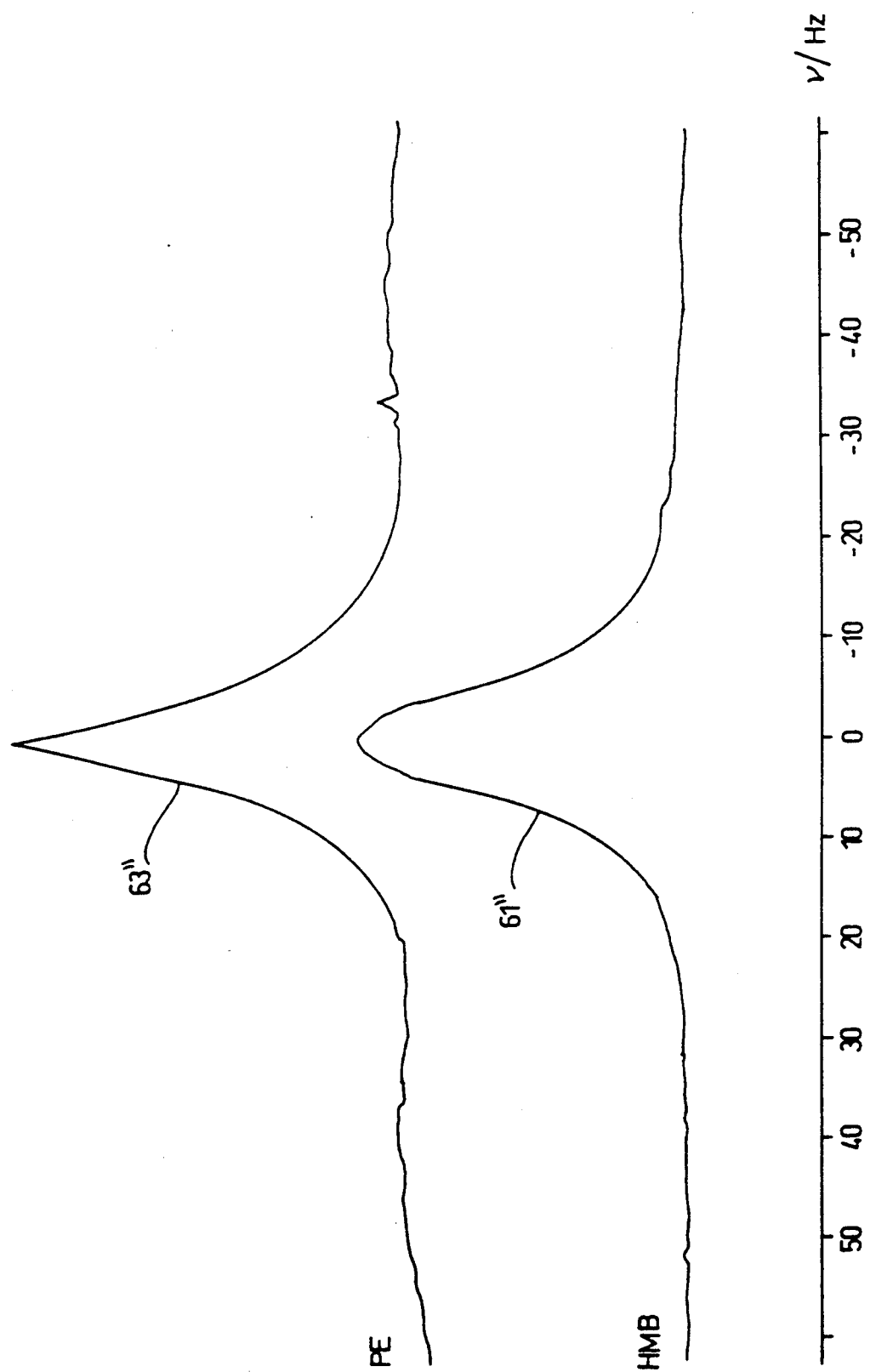
FIG. 6 shows an expanded view of two nuclear magnetic resonance spectra from FIG. 5a and 5b.

In pictures 5a), b), and c), one clearly sees that varying signal intensities and varying line shapes were measured. This is especially clear from the enlarged picture of FIG. 6 where the hexamethylbenzene 61'' and polyethylene 63'' lines are again shown individually.

The measured signals can therewith be evaluated in various different ways. One can, for example, determine the frequency of every signal maximum, the line width, or higher order moments. Assuming that these parameters can be associated with certain material properties, it is, in principle, possible to display these measurement results as images by associating every measurement value with a corresponding value of a predetermined grey scale.

Figure 7:
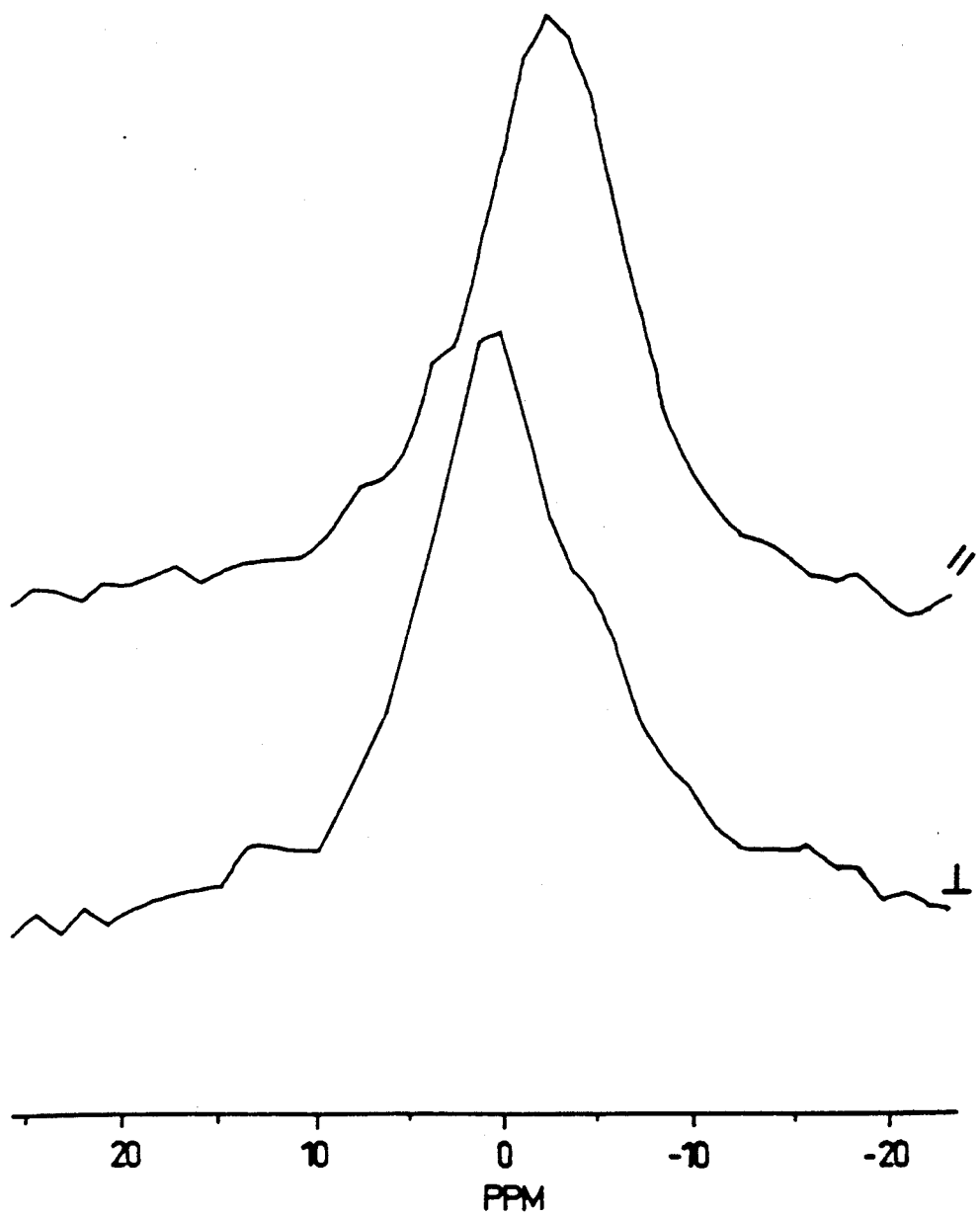
FIG. 7 shows two proton nuclear magnetic resonance spectra of a plastic sample which were taken for different orientations of the sample with respect to the constant magnetic field.

FIG. 7 shows results of measurements of a polyparaaromatic amide sample, commercially known as Kevlar. In this measurement, the sample was aligned in different ways relative to the magnet field, namely one time parallel and one time perpendicular to the magnet field as is indicated near the two lines of FIG. 7 with the corresponding symbols. One notices that both the line shape as well as the position of the maximum changes as a function of orientation with respect to the external magnet field.

Finally, the angular dependence of the signal maximum is presented in FIG. 8. The parameter shown here can, for example, be utilized to produce contrast in images in which the chain orientation of a plastic material should be represented.

We claim:

1. A method for a two-dimensional measurement of magnetic resonance in defined small volume regions of a solid-state sample, comprising the steps of:

arranging said sample in a uniform homogeneous magnetic field having a predetermined direction;

irradiating said sample with a sequence of gradient magnetic field pulses in such a way that a spin magnetization to be measured is maintained for a time interval being longer than a switch-off time of said gradient magnetic field pulses;

in a first time interval transferring said magnetization of only one slice of said sample into a first transverse magnetization, tilted by 90° with respect to said predetermined direction;

in a second time interval, succeeding said first time interval, switching on volume selective gradient magnetic field pulses;

in a third time interval, succeeding said second time interval, during persistence of said volume selective gradient magnetic field pulse, irradiating onto said sample high frequency pulses transferring said first transverse magnetization within said volume region to be measured into a multipole-state, said state being insensitive to said volume selective gradient magnetic field pulse and persisting until after a point in time when said volume selective gradient magnetic field pulses are switched-off;

in a fourth time interval succeeding said third time interval, transferring said multipole-state back into a second transverse magnetization; and reading out said second transverse magnetization as a measuring signal.

2. The method of claim 1, wherein said transverse magnetization is produced in said first time interval through a first pulse sequence consisting of a first hard high frequency pulse immediately followed by a spin-lock pulse with a phase position shifted by 90° with respect to said first 90° high frequency pulse as well as, immediately thereafter, a second 90° high frequency pulse whose phase position is shifted by 180° with respect to the first 90° high frequency pulse.

3. The method of claim 1, wherein said second pulse sequence for said transfer into and out of said multipole-state consists of a 90° high frequency pulse followed, after said third time interval, by a first 45° high frequency pulse as well as, following a further time interval, a second 45° high frequency pulse whereby, preferably, said 45° high frequency pulses have equal alternate phase positions with respect to said 90° high frequency pulse or are adjusted to be shifted by 90°.

4. The method of claim 1, wherein said gradient magnetic field pulses are step-wise encoded in amplitude.

5. A method for a three-dimensional measurement of magnetic resonance in defined small volume regions of a solid-state sample, comprising the steps of:

arranging said sample in a uniform homogeneous magnetic field;

irradiating said sample with a sequence of gradient magnetic field pulses in such a way that a spin magnetization to be measured is maintained for a time interval being longer than a switch-off time of said gradient magnetic field pulses;

in a first time interval switching on volume selective gradient magnetic field pulses;

in a second time interval succeeding said first time interval, irradiating said sample during the persistence of said volume selective gradient magnetic field pulses with high frequency pulses for transferring said magnetization in said volume region to be measured into a multipole-state, said state being insensitive to said volume selective gradient magnetic field pulses and persisting until after a point in time at which said gradient magnetic field pulses are switched off;

transferring said magnetization back out of said multipole-state; and reading out said magnetization as a measuring signal.

6. The method of claim 5, wherein said second pulse sequence for said transfer into and out of said multipole-state consists of a 90° high frequency pulse followed, after said third time interval, by a first 45° high frequency pulse as well as, following a further time interval, a second 45° high frequency pulse whereby, preferably, said 45° high frequency pulses have equal alternate phase positions with respect to said 90° high frequency pulse or are adjusted to be shifted by 90°.

7. The method of claim 5, wherein said gradient magnetic field pulses are step-wise encoded in amplitude.

* * * * *